(12) United States Patent
Nakayama

(10) Patent No.: US 12,707,578 B2
(45) Date of Patent: Aug. 11, 2026

(54) ELECTRONIC DEVICE

(71) Applicant: KYOCERA Corporation, Kyoto (JP)

(72) Inventor: Takayuki Nakayama, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 190 days.

(21) Appl. No.: 18/590,511

(22) Filed: Feb. 28, 2024

(65) Prior Publication Data

US 2024/0334627 A1 Oct. 3, 2024

(30) Foreign Application Priority Data

Mar. 27, 2023 (JP) ................................ 2023-050208

(51) Int. Cl.
*H05K 5/02* (2006.01)
*H04B 1/3888* (2015.01)

(52) U.S. Cl.
CPC ......... *H05K 5/0217* (2013.01); *H04B 1/3888* (2013.01)

(58) Field of Classification Search
CPC ... H05K 5/0217; G06F 1/1656; G06F 1/1626; H04M 1/18; H04M 1/185; H04M 1/03
See application file for complete search history.

(56) References Cited

U.S. PATENT DOCUMENTS 8,774,882 B2 * 7/2014 Tages .................... H04M 1/185 455/575.8
8,775,710 B1 * 7/2014 Miller .................. G06F 1/1632 361/679.19
9,612,622 B2 * 4/2017 Moon ...................... H02H 6/00
9,700,112 B1 * 7/2017 Samson ................. A45C 11/00
10,505,577 B2 * 12/2019 Lin ....................... H04M 1/026
11,600,900 B2 * 3/2023 Sando ................. H04M 1/0249
2014/0138265 A1 * 5/2014 Bong ..................... A45C 11/00 206/37
2014/0252786 A1 * 9/2014 Singhal ................. H04M 1/185 294/137
2018/0063302 A1 * 3/2018 Suzuki ................ H04M 1/0202
2018/0110143 A1 * 4/2018 Zhao ..................... G06F 1/1626
2018/0343332 A1 * 11/2018 Kim ...................... H04M 1/026
2022/0239771 A1 * 7/2022 Ando .................... H04M 1/185

FOREIGN PATENT DOCUMENTS

JP H089448 A 1/1996

* cited by examiner

*Primary Examiner* — Sagar Shrestha
(74) *Attorney, Agent, or Firm* — Studebaker Brackett PLLC

(57) ABSTRACT

An electronic device includes a housing, an impact-absorption member, and one or more electronic components inside housing. The housing includes a first side surface extending in a first direction, a second side surface extending in a second direction different from the first direction, and a first corner of the first side surface and the second side surface. The impact-absorption member includes a first end portion branched into a first tine and a second tine that are extending along the first side surface from the first corner, and a middle portion covering the second side surface. extends along both the first side surface and the second side surface from the corner portion. The impact-absorption member includes a bifurcate end portion extending along the first side surface.

9 Claims, 15 Drawing Sheets

12
20
21
22
10
19
61
63
71
72
(1)
(2)
(3)
(4)
40
41
42
43
44
45
46
47
48
Z
X
Y 41
41A
10
13
12
71
71A
L1
61
42A
42
Z
Y
X 13
12
12A
L3
45A
45
10
X
Z
Y

ELECTRONIC DEVICE

CROSS REFERENCE TO RELATED APPLICATIONS

The present invention contains subject matter related to Japanese Patent Application No. 2023-50208 filed in the Japan Patent Office on Mar. 27, 2023, the entire contents of which are incorporated herein by reference.

BACKGROUND OF THE INVENTION

1. Field of the Invention

The present disclosure relates to an electronic device.

2. Description of the Related Art

A known mobile phone includes cushioning members disposed at outer surfaces to increase the impact resistance (for example, see Japanese Unexamined Patent Application Publication No. 8-9448).

SUMMARY OF THE INVENTION

In an embodiment of the present disclosure, an electronic device includes a housing, an impact-absorption member, and one or more electronic components inside housing. The housing includes a first side surface extending in a first direction, a second side surface extending in a second direction different from the first direction, and a first corner of the first side surface and the second side surface. The impact-absorption member includes a first end portion branched into a first tine and a second tine that are extending along the first side surface from the first corner, and a middle portion covering the second side surface.

DESCRIPTION OF THE PREFERRED EMBODIMENTS

Improving freedom in arranging elements in an electronic device is desired without sacrificing the impact resistance of the device. The present disclosure is directed to improve the freedom in arranging elements in the electronic device while securing the impact resistance of the device.

The electronic device of the present embodiment may be a portable electronic device, such as a mobile phone or a smart phone. The electronic device of the present embodiment, however, is not limited to the portable electronic device. The electronic device may be electronic device of various types, such as a desktop computer, a laptop computer, a tablet computer, a home appliance, a device for industrial use or for factory automation, or a special purpose terminal.

Figure 1:
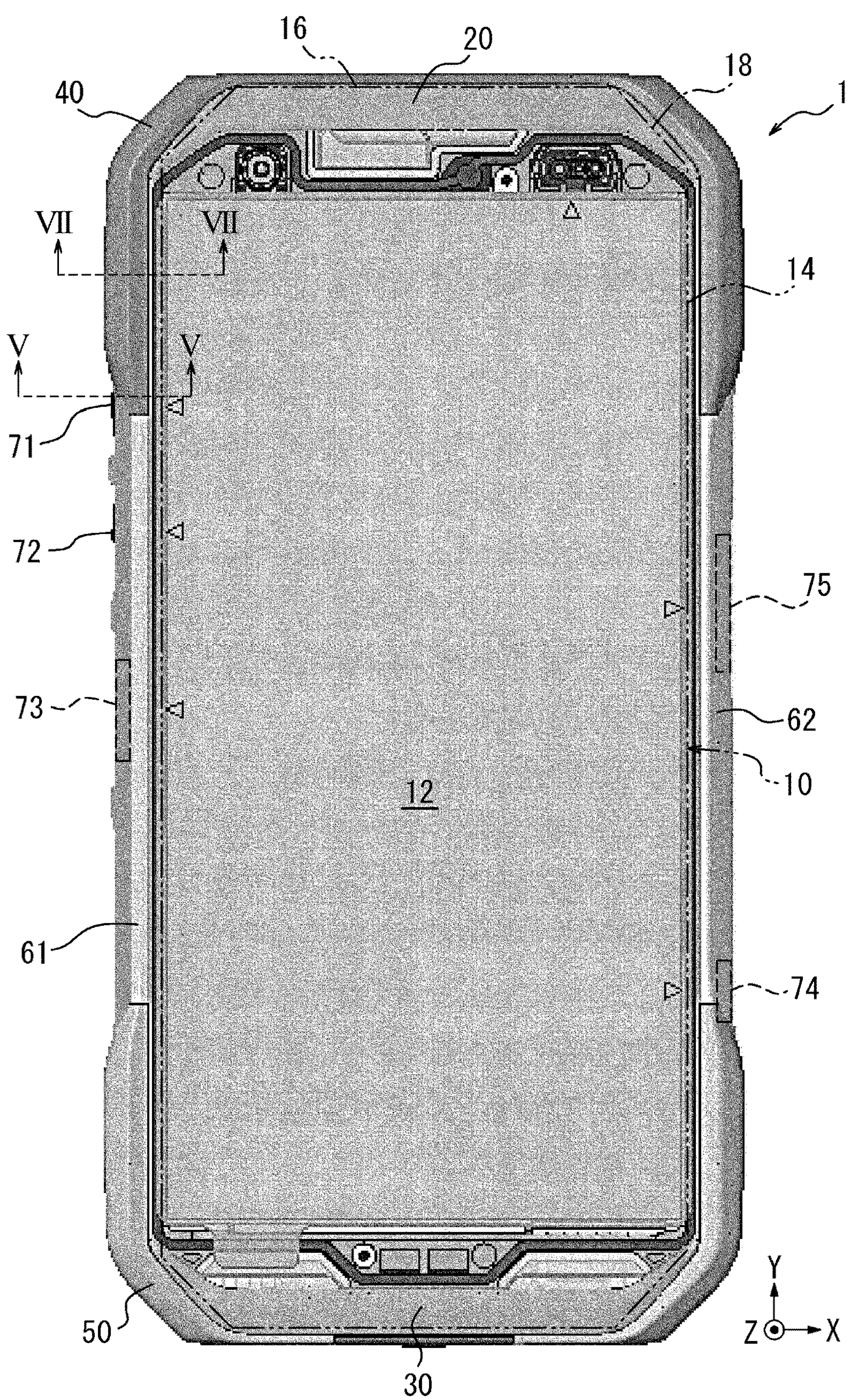
FIG. 1 is a plan view illustrating an example of an electronic device according to an embodiment.

General Structure of Electronic Device 1 As illustrated in FIG. 1, an electronic device 1 according to an embodiment includes a housing 10 and a display 12. The housing 10 holds the display 12. For example, the display 1 can be a display device, such as a liquid crystal display, an organic electroluminescence display, an inorganic electroluminescence display, but is not limited thereto. The display 12 can be configured as a touch panel equipped with touch sensors.

In the present embodiment, the housing 10 is shaped substantially like a cuboid. The housing 10 includes a first face at which the display 12 is positioned and a second face facing opposite to the first face. The first face faces in the positive z direction (i.e., in the direction being parallel to the z-axis and directed toward the positive z side). The first face is also referred to as the “front face”. The second face faces in the negative z direction (i.e., in the direction being parallel to the z-axis and directed toward the negative z side). The second face is also referred to as the “rear face”. The housing 10 also includes four side faces positioned between the first face and the second face. The housing 10 includes two first side surfaces 14 that extend in the y direction (i.e., the direction parallel to the y-axis) at respective two side faces and also includes two second side surfaces 16 that extend in the x direction (i.e., the direction parallel to the x-axis) at other two side faces. The y direction is also referred to as the “first direction”. The x direction is also referred to as the “second direction”. The first side surfaces 14 are longer than the second side surfaces 16. In other words, the first face and the second face are each shaped substantially like a rectangle of which the sides extending in the first direction are longer than the sides extending in the second direction. The first direction corresponds to the longitudinal direction of the housing 10. The second direction corresponds to the transverse direction of the housing 10. The housing 10 further includes corners 18 positioned at respective intersections between the first side surfaces 14 and the second side surfaces 16.

In the present embodiment, the housing 10 includes six major faces. The faces of the housing 10 are not limited to flat faces but may be curved ones. The faces of the housing

10 may be connected so as to intersect each other. The faces of the housing 10 can be connected to each other gradually and smoothly. The number of major faces of the housing 10 is not limited to six. The shape of the housing 10 is not limited to a cuboid but may be one other than the cuboid.

The electronic device 1 includes an upper end cover 20 positioned at an end of the electronic device 1, the end facing in the positive y direction (i.e., in the direction being parallel to the y-axis and directed toward the positive y side). The electronic device 1 also includes a lower end cover 30 positioned at an end of the electronic device 1, the end facing in the negative y direction (i.e., in the direction being parallel to the y-axis and directed toward the negative y side). The upper end cover 20 and the lower end cover 30 extend along respective second side surfaces 16 of the housing 10. The upper end cover 20 and the lower end cover 30 are also referred to as "end covers".

The electronic device 1 includes an impact-absorption member 40 at the end of the electronic device 1 facing in the positive y direction and also includes an impact-absorption member 50 at the end of the electronic device 1 facing in the negative y direction. Each of the impact-absorption members 40 and 50 is positioned at a first side surface 14, a corner 18, and a second side surface 16 of the housing 10. In other words, the impact-absorption member 40 and the impact-absorption member 50 extend along a first side surface 14 and also along a second side surface 16 from a corresponding corner 18 of the housing 10.

The electronic device 1 includes a side cover 61 positioned at an end of the electronic device 1, the end facing in the negative x direction (i.e., in the direction being parallel to the x-axis and directed toward the negative x side). The electronic device 1 also includes a side cover 62 positioned at an end of the electronic device 1, the end facing in the positive x direction (i.e., in the direction being parallel to the x-axis and directed toward the positive x side). The side covers 61 and 62 extend along respective first side surfaces 14 of the housing 10.

The electronic device 1 includes input portions 71, 72, and 73 positioned at the side cover 61 and also includes input portions 74 and 75 positioned at the side cover 62. The input portions 71, 72, 73, and 74 are physical buttons. For example, in the case of the electronic device 1 including a camera, the input portion 74 may serve as a shutter button. For example, the input portion 75 may serve as a fingerprint sensor. The input portions 71 to 75 are not limited to the above examples but may serve as other input devices. The number of the input portions of the electronic device 1 is not limited to five but may be four or less or six or more.

Figure 2A:
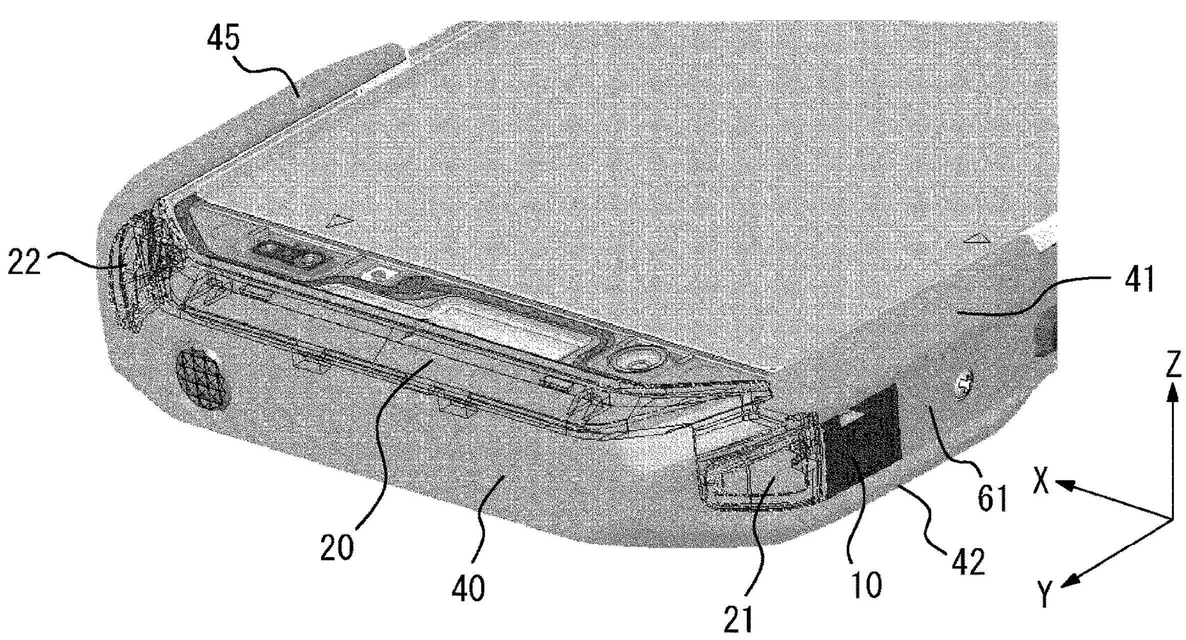
FIG. 2A is a perspective view illustrating an upper end cover of the electronic device, the upper end cover being represented in wireframe.
Figure 2B:
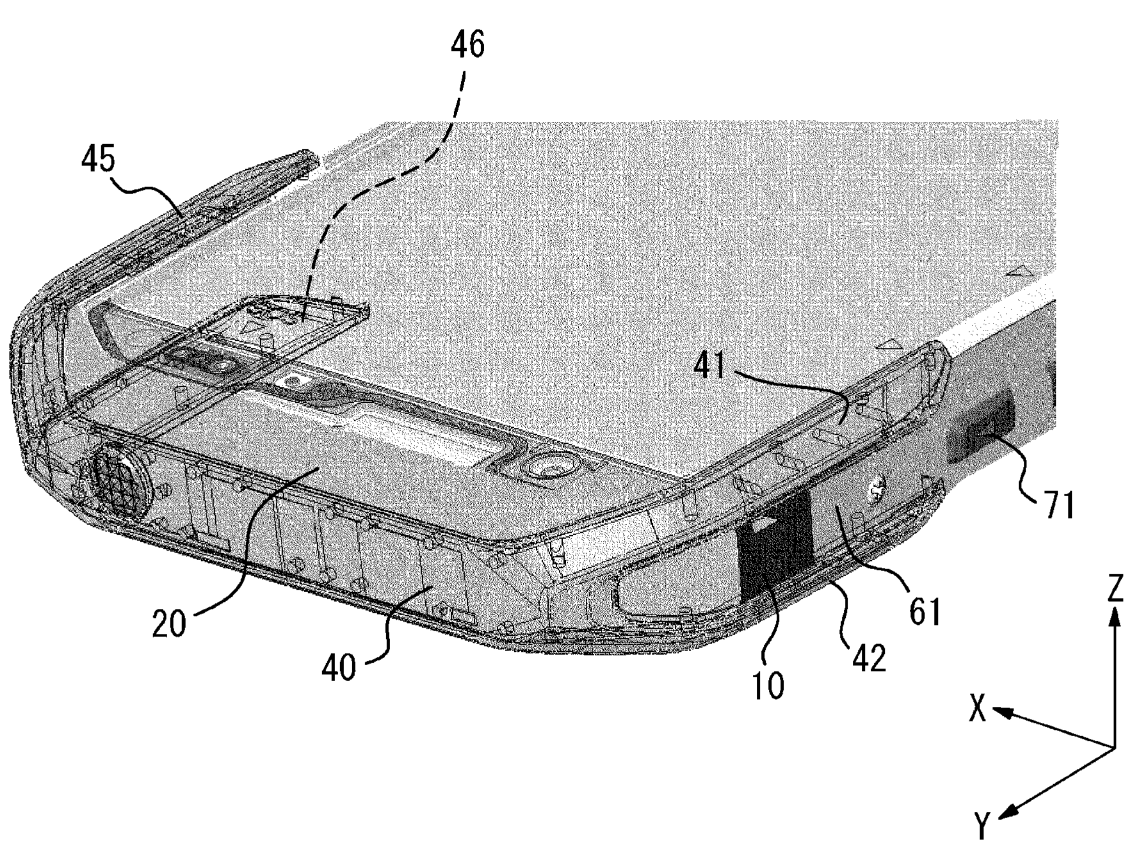
FIG. 2B is a perspective view illustrating an upper impact-absorption member of the electronic device, the impact-absorption member being represented in wireframe.

As illustrated in FIG. 2A, the upper end cover 20 includes an engagement portion 21 at an end thereof facing in the negative x direction and also includes an engagement portion 22 at an end thereof facing in the positive x direction. As illustrated in FIG. 2B, the impact-absorption member 40 include protrusions 41 and 42 at a first side surface 14 facing in the negative x direction. The tines 41 and 42 extend in the negative y direction. In addition, the impact-absorption member 40 include tines 45 and 46 at a first side surface 14 facing in the positive x direction. The tines 45 and 46 extend in the negative y direction.

Figure 2C:
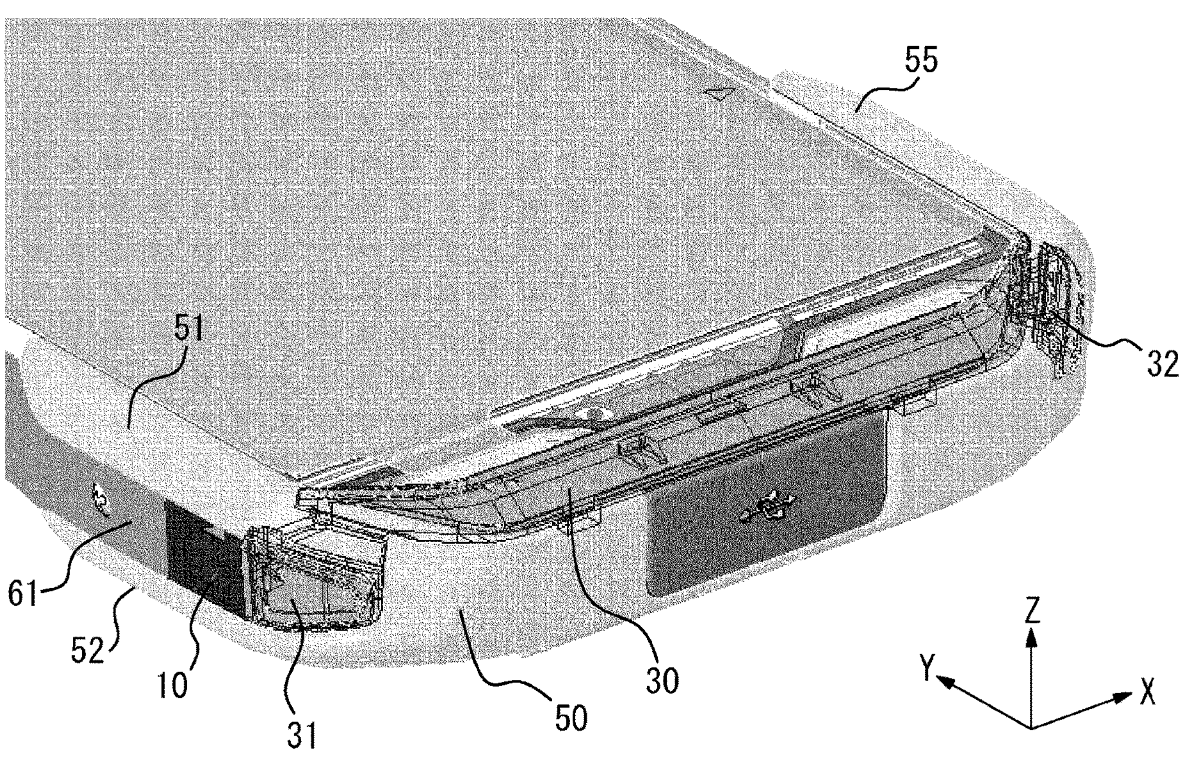
FIG. 2C is a perspective view illustrating a lower end cover of the electronic device, the lower end cover being represented in wireframe.
Figure 2D:
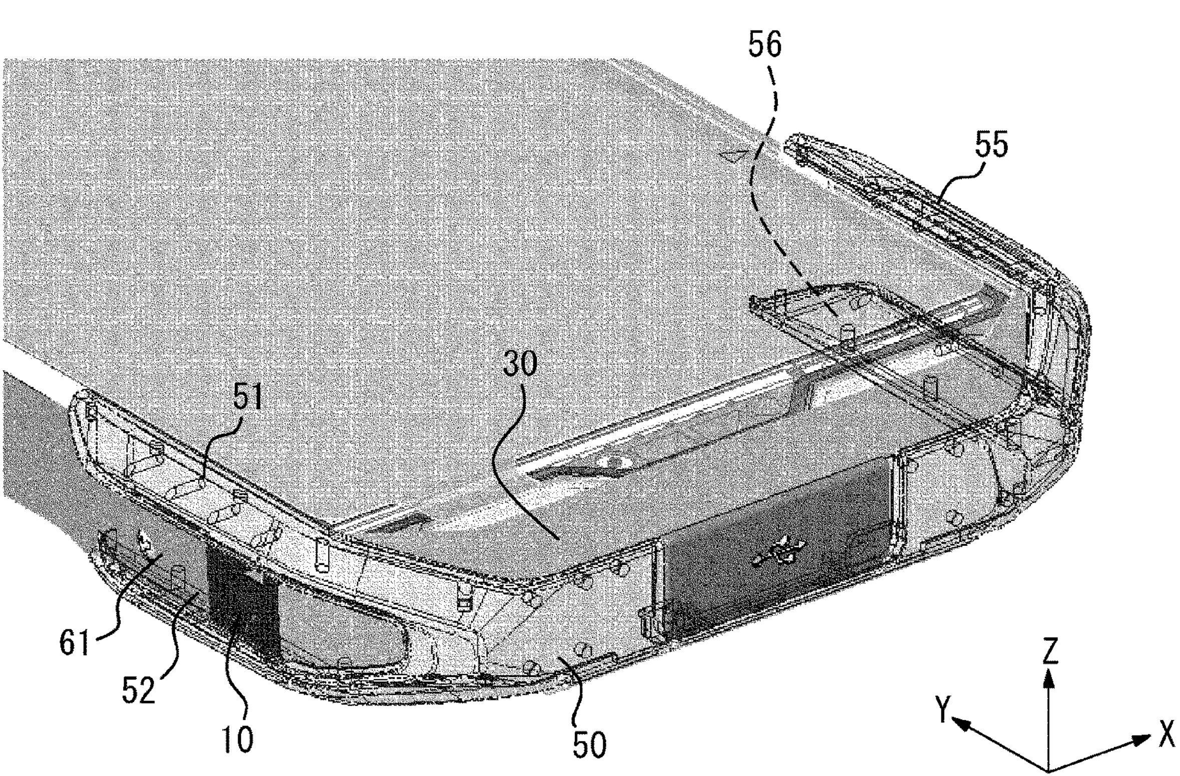
FIG. 2D is a perspective view illustrating a lower impact-absorption member of the electronic device, the impact-absorption member being represented in wireframe.

As illustrated in FIG. 2C, the lower end cover 30 includes an engagement portion 31 at an end thereof facing in the negative x direction and also includes an engagement portion 32 at an end thereof facing in the positive x direction. As illustrated in FIG. 2D, the impact-absorption member 50 include tines 51 and 52 at the first side surface 14 facing in the negative x direction. The tines 51 and 52 extend in the positive y direction. In addition, the impact-absorption member 50 include tines 55 and 56 at the first side surface 14 facing in the positive x direction. The tines 55 and 56 extend in the positive y direction. Accordingly, the impact-absorption member 50 includes branched end portions extending along respective first side surfaces 14.

Each of the impact-absorption members 40 and 50 includes branched end portions extending along respective first side surfaces 14. Each of the impact-absorption members 40 and 50 extends along the first side surfaces 14 from two corners 18 positioned at both ends of a corresponding second side surface 16 of the housing 10. Each of the impact-absorption members 40 and 50 includes the branched end portions extending along respective first side surfaces 14 from corresponding corners 18.

Assembling Steps of Housing 10

Referring to FIGS. 3, 4A, 4B, and 4C, the following describes steps of assembling the upper end cover 20, the impact-absorption member 40, and the side cover 61 at an end of the electronic device 1, the end facing in the positive y direction.

Figure 3:
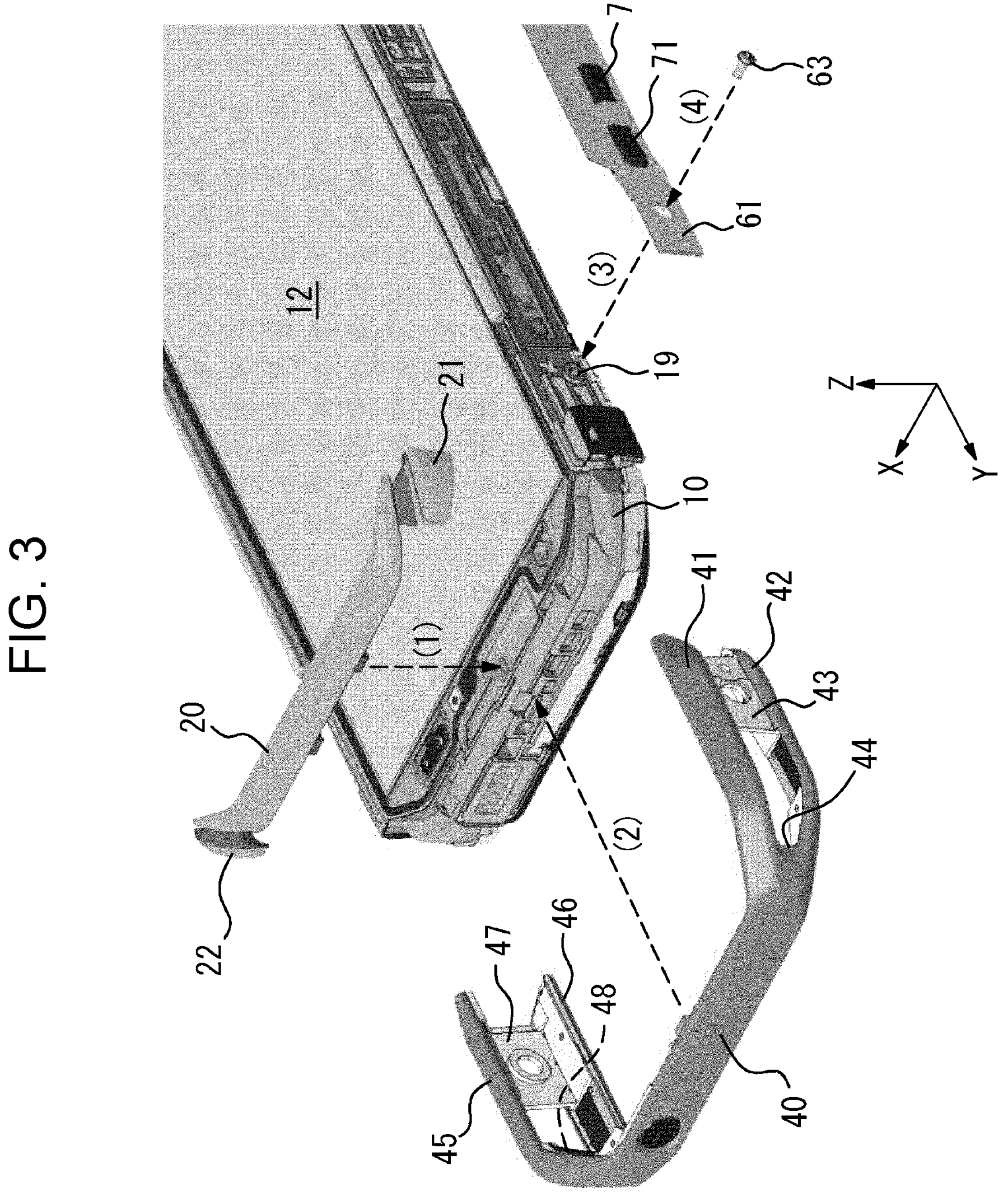
FIG. 3 is an exploded perspective view illustrating the upper end cover, the impact-absorption member, and a side cover that are included in the electronic device.
Figure 4A:
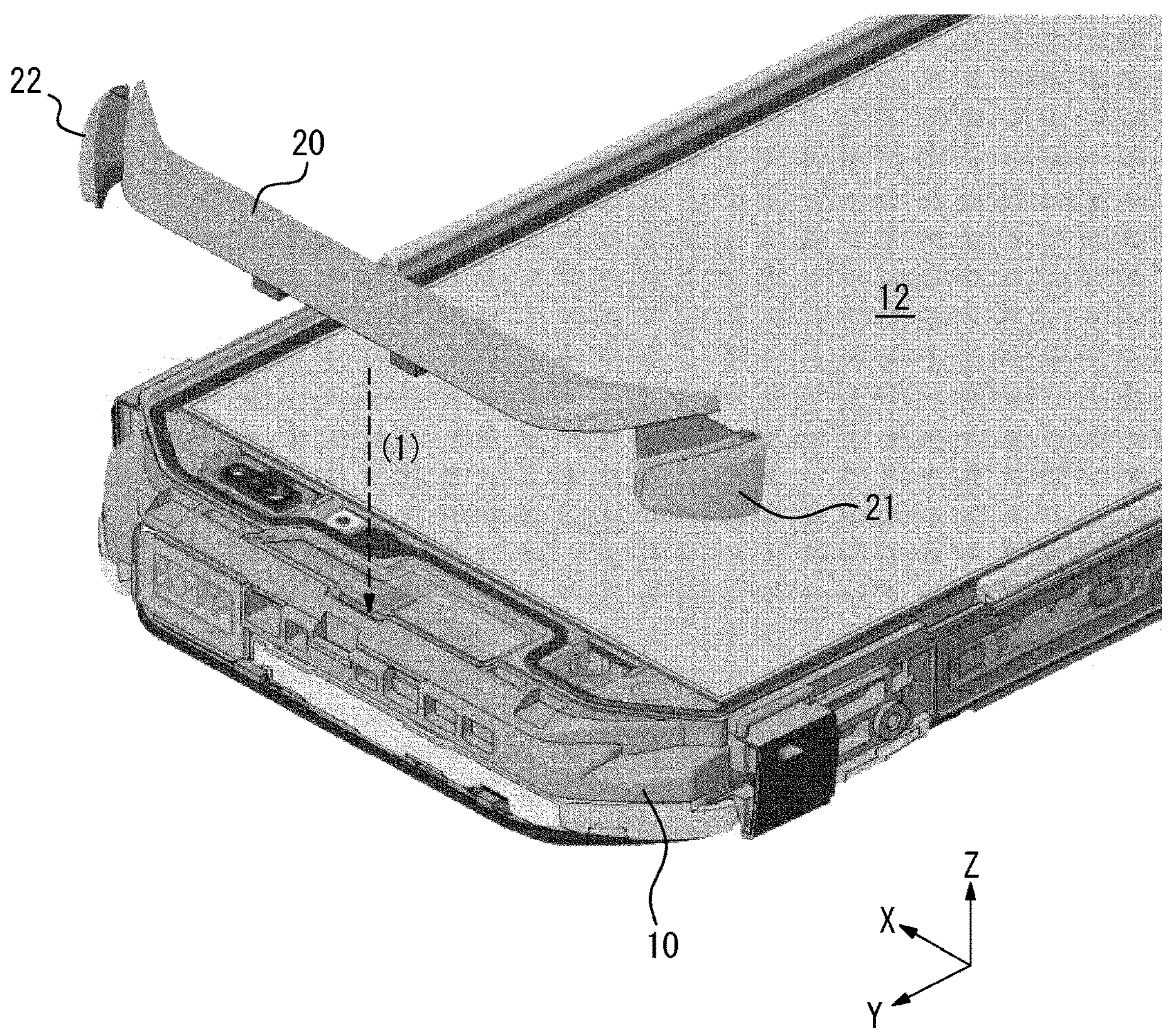
FIG. 4A is a view illustrating assembling step 1 of the electronic device.

In step (1), as indicated by dashed arrow (1) in FIGS. 3 and 4A, the upper end cover 20 is attached to the front face of the housing 10 at the end of the housing 10 facing in the positive y direction. The upper end cover 20 includes the engagement portion 21 at the end of the cover facing in the negative x direction and also includes the engagement portion 22 at the end of the cover facing in the positive x direction.

Figure 4B:
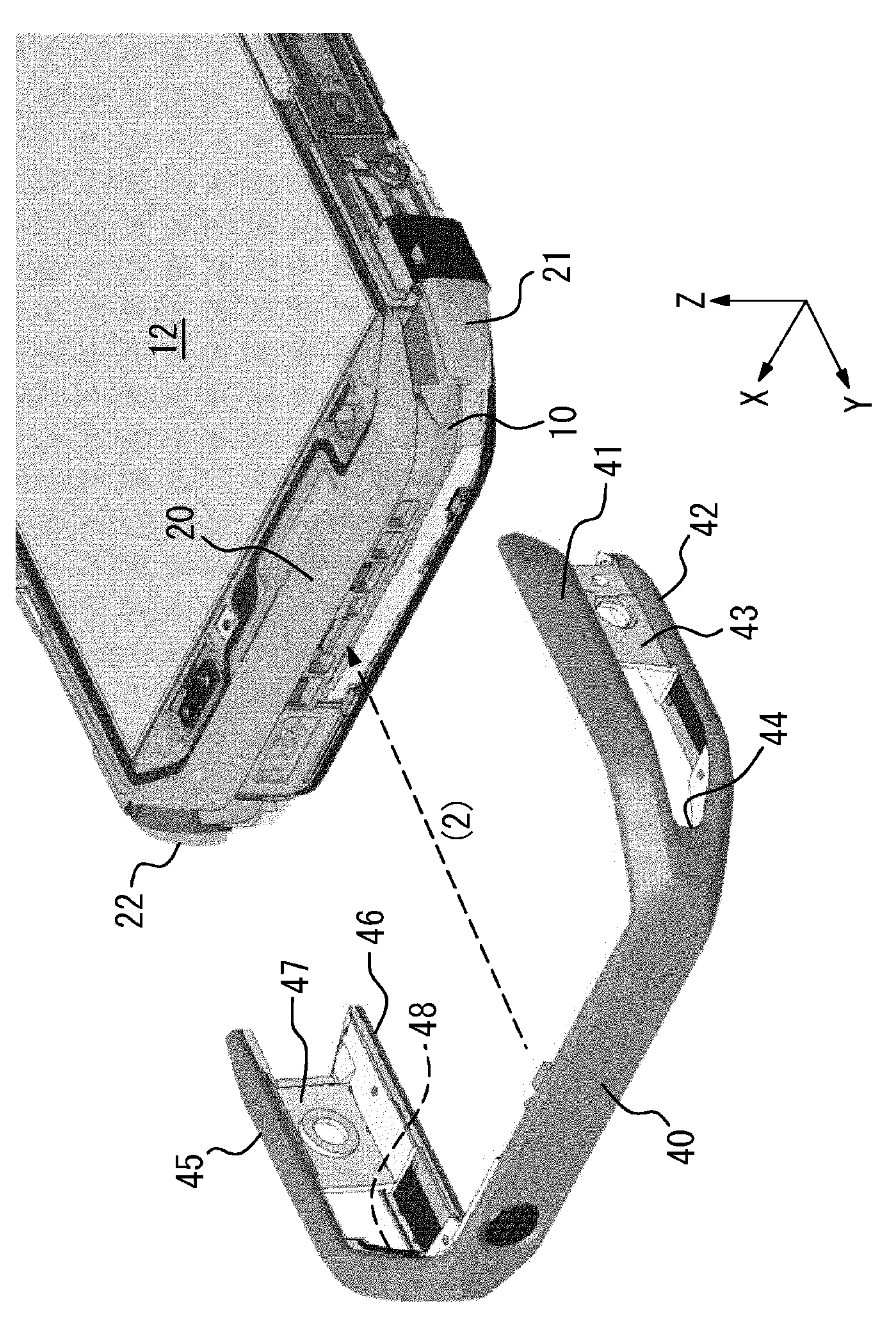
FIG. 4B is a view illustrating assembling step 2 of the electronic device.

In step (2), as indicated by dashed arrow (2) in FIGS. 3 and 4B, the impact-absorption member 40 is attached to the housing 10 in the negative y direction to fix the upper end cover 20 to the housing 10. The impact-absorption member 40 is branched into the tines 41 and 42 extending along the first side surface 14 that faces in the negative x direction. The impact-absorption member 40 is also branched into the tines 45 and 46 extending along the first side surface 14 that faces in the positive x direction. The impact-absorption member 40 includes a branching portion 44 at which the tines 41 and 42 are separated from each other and a branching portion 48 at which the tines 45 and 46 are separated from each other. The impact-absorption member 40 also includes a connection portion 43 positioned between the tines 41 and 42 and a connection portion 47 positioned between the tines 45 and 46.

In the impact-absorption member 40, the branching portions 44 and 48 are positioned at respective corners 18 of the housing 10. In other words, the impact-absorption member 40 is branched at corners 18. The tines 41 and 42 are separated from each other at the branching portion 44 positioned at a corresponding corner 18 and extend along the corner 18 and one of the first side surfaces 14. The tines 45 and 46 are separated from each other at the branching portion 48 positioned at another corresponding corner 18 and extend along the corner 18 and the other first side surface 14.

The impact-absorption member 40 is attached to the housing 1 in such a manner that the engagement portion 21 of the upper end cover 20 engages a portion of the impact-absorption member 40, the portion being surrounded by the branching portion 44 and the tines 41 and 42. In the attachment of the impact-absorption member 40, the engagement portion 22 of the upper end cover 20 also engages a portion of the impact-absorption member 40, the portion being surrounded by the branching portion 48 and the tines 45 and 46. Accordingly, the impact-absorption member 40 engages the engagement portions 21 and 22 of the upper end cover 20 and thereby fixes the upper end cover 20 to the housing 10.

Figure 4C:
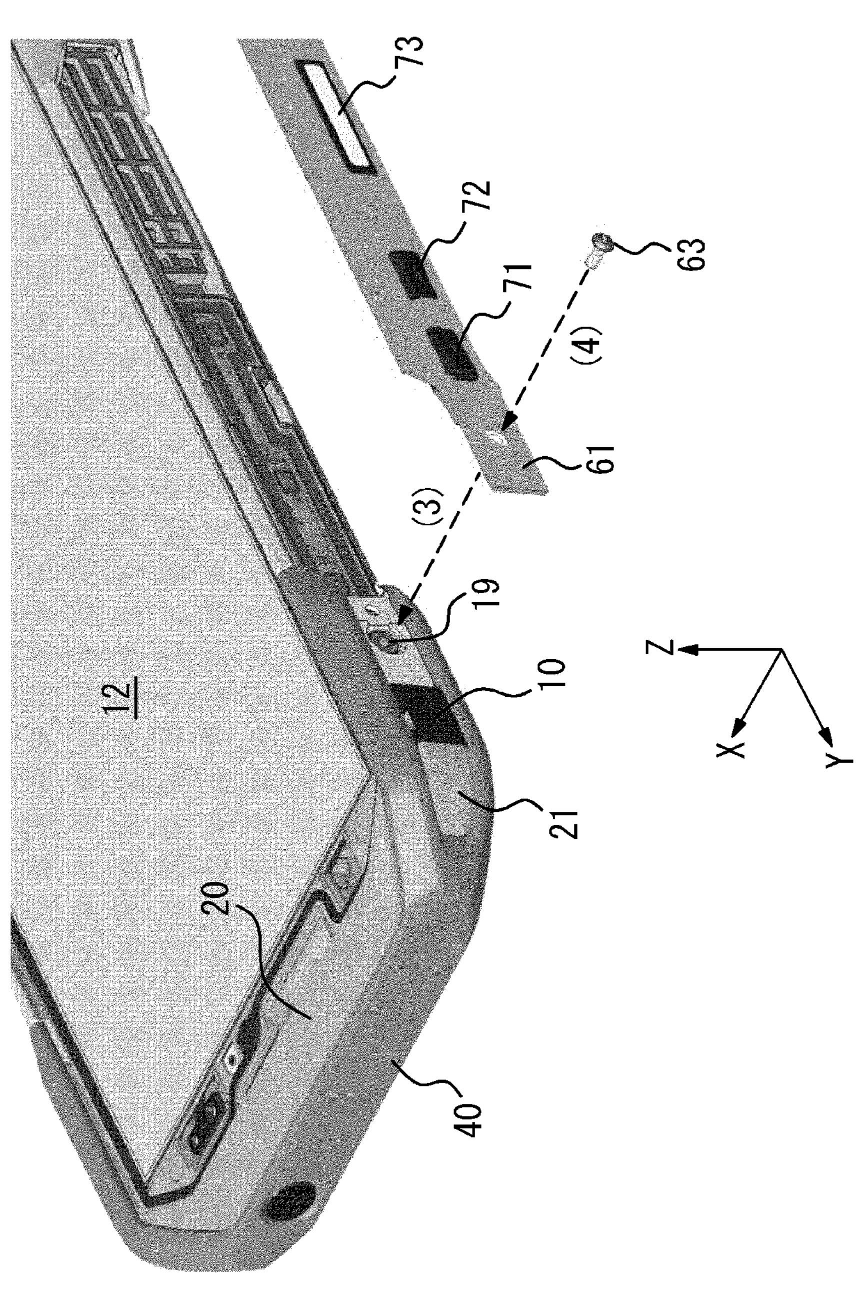
FIG. 4C is a view illustrating assembling steps 3 and 4 of the electronic device.

In step (3), as indicated by dashed arrow (3) in FIGS. 3 and 4C, the side cover 61, which faces in the negative x direction, is attached to the housing 10 in the positive x direction to fix the impact-absorption member 40 to the housing 10. In the attachment of the side cover 61, the side cover 61 is joined to the connection portion 43 of the impact-absorption member 40. In step (4), as indicated by dashed arrow (4), a screw 63 is screwed in a tapped hole 19 of the housing 10. When the side cover 61 is attached to the housing 10 using the screw 63, the connection portion 43 of the impact-absorption member 40 is thereby fixed to the housing 10.

Similarly, the side cover 62, which faces in the positive x direction, is attached to the housing 10 in the negative x direction to fix the impact-absorption member 40 to the housing 10. In the attachment of the side cover 62, the side cover 62 is joined to the connection portion 47 of the impact-absorption member 40. The side cover 62 is attached to the housing 10 using a screw. This causes the side cover 62 to fix the connection portion 47 of the impact-absorption member 40 to the housing 10.

Thus, the connection portions 43 and 47 of the impact-absorption member 40 are fixed to the housing 10 by fixing the side covers 61 and 62 to the housing 10. The engagement portions 21 and 22 of the upper end cover 20 are fixed to the housing 10 by fixing the impact-absorption member 40 to the housing 10. Accordingly, the upper end cover 20 and the impact-absorption member 40 can be fixed to the housing 10 without using a joining member, such as the screw 63, simply by fixing the side covers 61 and 62 to the housing 10.

The assembling steps of cover members at the end of the electronic device 1 facing in the positive y direction have been described. The similar steps are employed in the assembly of cover members at the end of the electronic device 1 facing in the negative y direction.

Protection of Components of Electronic Device 1 Using Impact-Absorption Members 40 and 50

Figure 5:
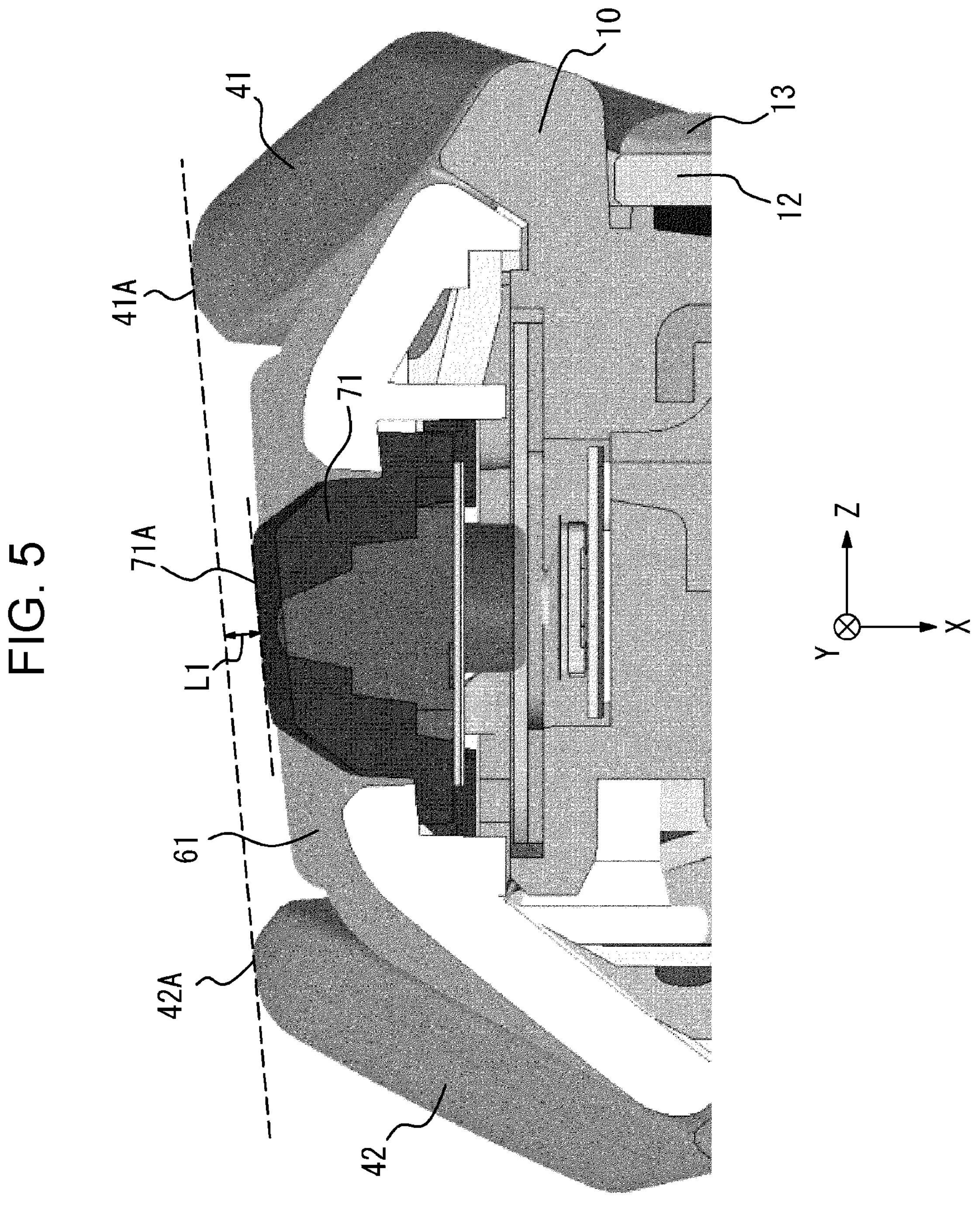
FIG. 5 is a cross-sectional view taken along line V-V in FIG. 1.
Figure 6:
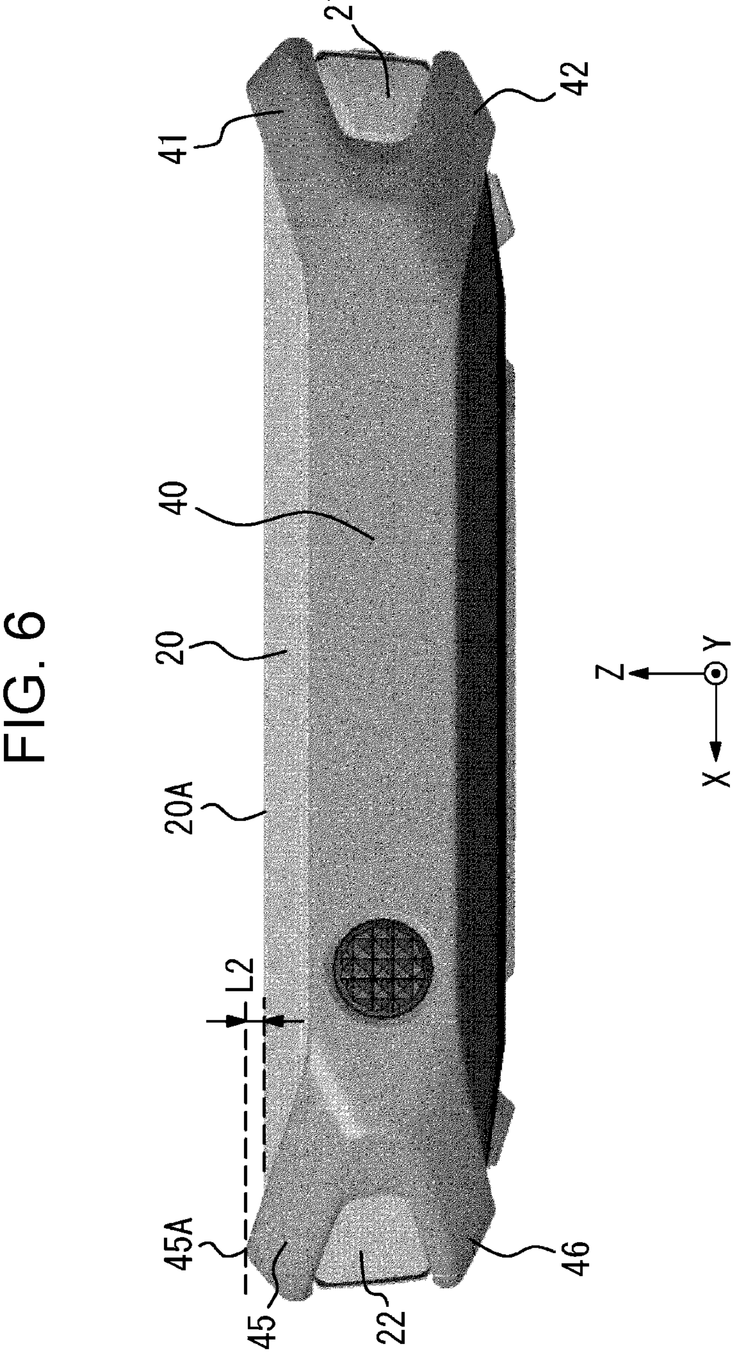
FIG. 6 is an example top view illustrating the electronic device.

As illustrated in FIG. 5, which is a cross-sectional view of the first side surface 14 of the housing 10 facing in the negative x direction, an input portion 71 is disposed in the side cover 61. The input portion 71 serves as an operation key. The input portion 71 has an end 71A positioned so as to protrude from the side cover 61. The tines 41 and 42 of the impact-absorption member 40 have respective ends 41A and 42A positioned so as to protrude from the side cover 61 in the negative x direction. When a line is drawn so as to connect the end 41A to the end 42A of the impact-absorption member 40 and a parallel line is drawn so as to be parallel to the line and to pass through the end 71A of the input portion 71, the line is positioned away from the parallel line by a length L1 in the negative x direction. To put it conversely, the end 71A of the input portion 71 is positioned so as to retreat by the length L1 from the ends 41A and 42A of the impact-absorption member 40. Accordingly, when the first side surface 14 of the electronic device 1 collides against an object, such as a floor, the end 41A or the end 42A of the impact-absorption member 40 can protect the input portion 71. The impact-absorption member 40 can protect not only the input portion 71 but also the input portion 72 to 75 in a similar manner. As illustrated in FIG. 6, when the electronic device 1 is viewed in the negative y direction, the upper end cover 20 has a face 20A positioned at the front face that faces in the positive z direction. The tine 45 of the impact-absorption member 40 has an end 45A positioned so as to protrude in the positive z direction. The end 45A of the tine 45 of the impact-absorption member 40 is positioned so as to protrude by a length L2 in the positive z direction from the face 20A of the upper end cover 20. To put it conversely, the face 20A of the upper end cover 20 is positioned so as to retreat by the length L2 in the negative z direction from the end 45A of the tine 45 of the impact-absorption member 40. Moreover, the face 20A of the upper end cover 20 is positioned so as to retreat in the negative z direction from the end of the tine 41 of the impact-absorption member 40. When the front side of the electronic device 1 collides against an object, such as a floor, the tine 41 or 45 of the impact-absorption member 40 can protect the upper end cover 20. The tine 51 or 55 of the impact-absorption member 50, which face the negative y direction, can also protect the lower end cover 30.

As illustrated in FIG. 6, when the second side surface 16 of the housing 10 is viewed, the impact-absorption member 40 has branched shapes at both ends and looks like the letter X. This appearance of the impact-absorption member 40 can improve overall aesthetic appearance of the electronic device 1.

Figure 7:
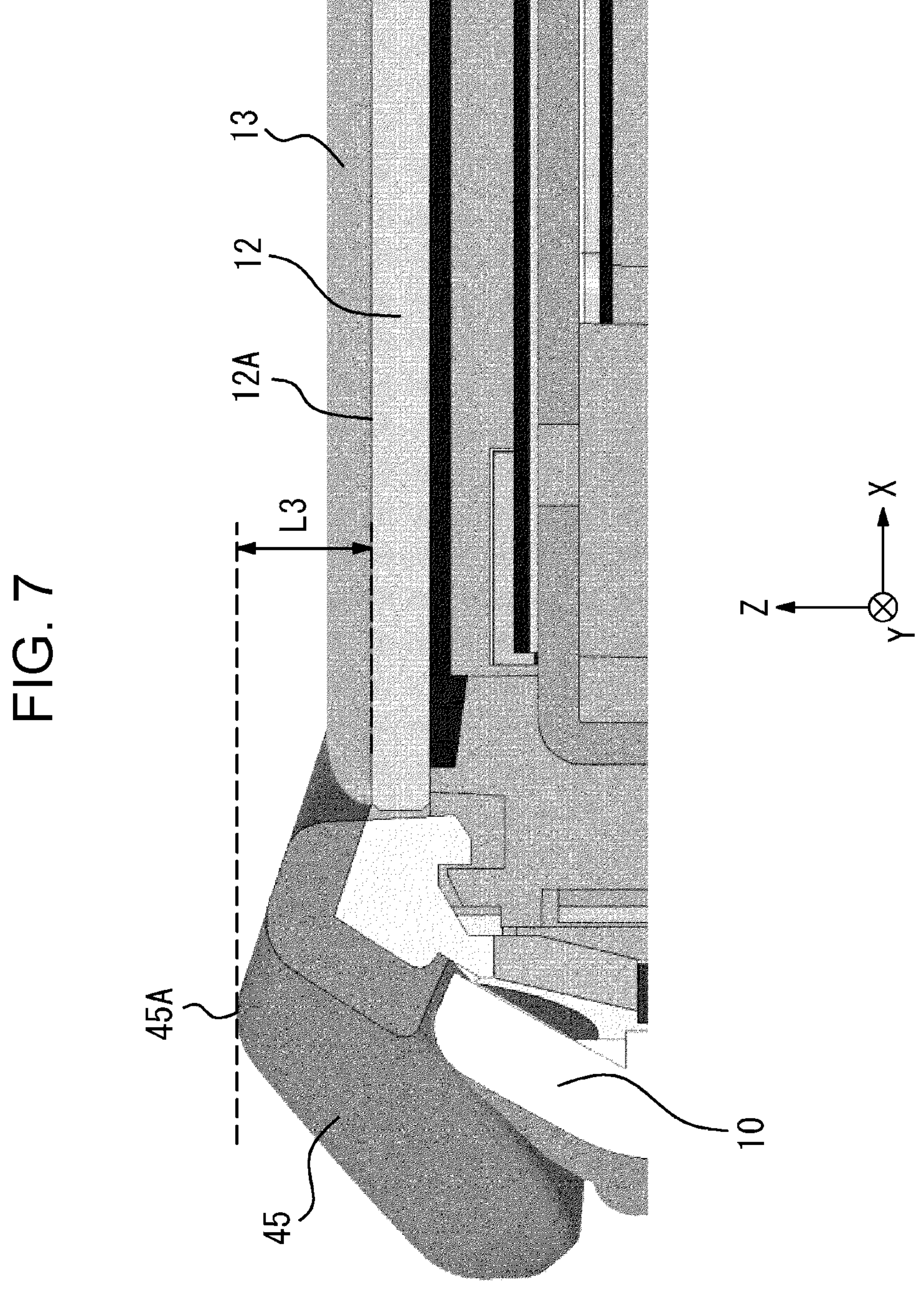
FIG. 7 is a cross-sectional view taken along line VII-VII in FIG. 1.

As illustrated in FIG. 7, which is a cross-sectional view of the electronic device 1 as viewed in the negative y direction, the display 12 has a surface 12A positioned at the front face that faces in the positive z direction. The end 45A of the protrusion 45 of the impact-absorption member 40 is positioned so as to protrude by a length L3 in the positive z direction from the surface 12A of the display 12. To put it conversely, the surface 12A of the display 12 is positioned so as to retreat in the negative z direction from the end 45A of the tine 45 of the impact-absorption member 40. Moreover, the surface 12A of the display 12 is positioned so as to retreat in the negative z direction from the end of the tine 41 of the impact-absorption member 40. Accordingly, when the front face of the electronic device 1 collides against an object, such as a floor, the tine 41 or 45 of the impact-absorption member 40 can protect the display 12. The tine 51 or 55 of the impact-absorption member 50, which faces the negative y direction, can also protect the display 12.

The z direction is also referred to as the "third direction". The z-axis intersects the x-axis and the y-axis. Accordingly, the third direction intersects the first direction and the second direction. The tine 45 of the impact-absorption member 40 protrudes in the third direction from the surface 12A of the display 12.

The display 12 may further include a protective film 13 adhered onto the surface 12A. The display 12 can be further protected by the protective film 13. The surface of the protective film 13 is positioned so as to retreat in the negative z direction from the ends of the tines 41 and 45 of the impact-absorption member 40 and also from the ends of the tines 51 and 55 of the impact-absorption member 50, the ends of the tines 41, 45, 51, and 55 facing in the positive z direction. Accordingly, the impact-absorption members 40 and 50 can also protect the protective film 13.

Figure 8:
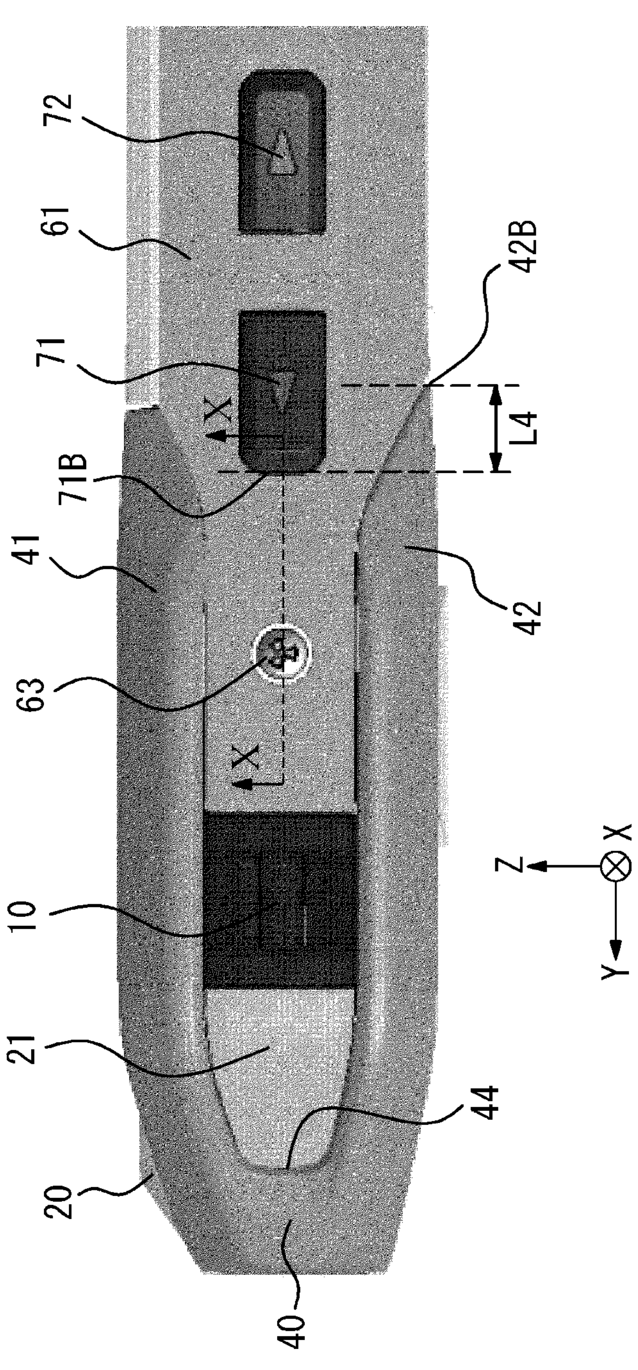
FIG. 8 is a view illustrating part of a left side surface of the electronic device.

As illustrated in FIG. 8, which is a plan view of the side cover 61, at least part of the input portion 71 may be positioned between the tines 41 and 42 of the impact-absorption member 40. In other words, the tines 41 and 42 into which the impact-absorption member 40 is branched at the branching portion 44 may protrude in the second direction from the at least part of the input portion 71 that is positioned between the tines 41 and 42 at the first side surface 14.

The tines 41 and 42 extend in the negative y direction. Assume that an end 42B of the tine 42 is positioned farther in the negative y direction than the end of the tine 41. The input portion 71 has an end 71B facing in the positive y direction. The end 71B of the input portion 71 facing in the positive y direction may be positioned farther in the positive y direction from the end 42B of the tine 42. The distance between the end 71B of the input portion 71 and the end 42B of the tine 42 along the y-axis is denoted by L4. When the first side surface 14 of the electronic device 1 collides against an object, such as a floor, the tines 41 and 42 of the impact-absorption member 40 can protect the input portion 71 since at least part of the input portion 71 is positioned between the protrusions 41 and 42.

Figure 9:
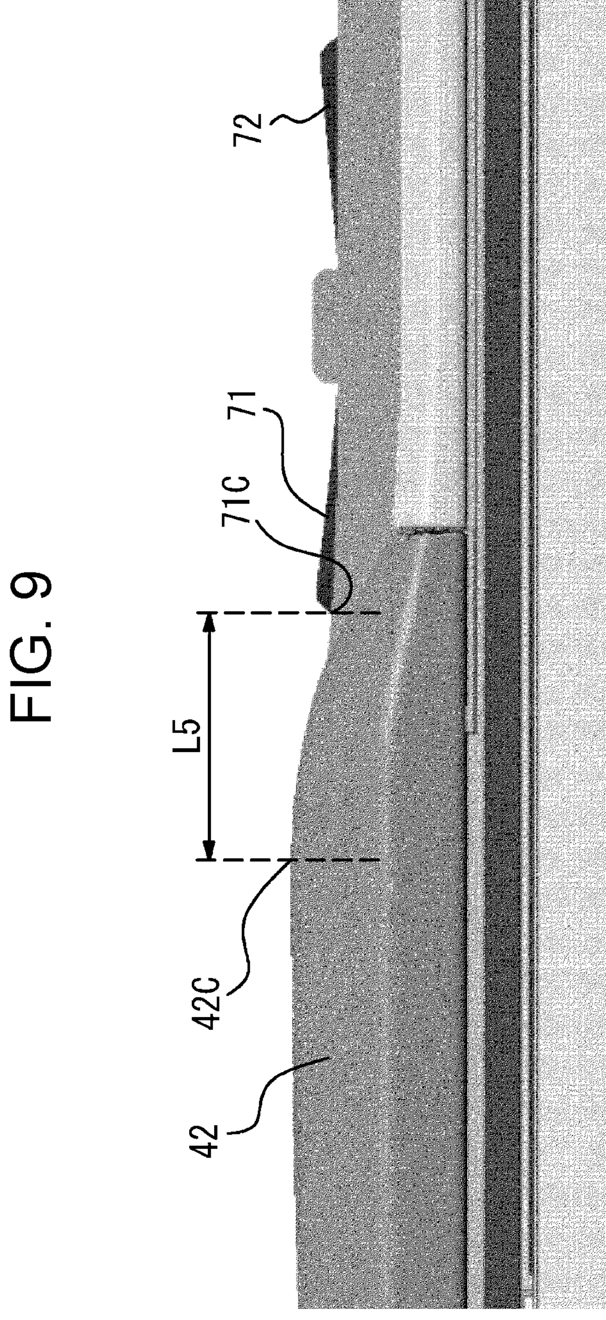
FIG. 9 is an example view illustrating part of the left side surface of the electronic device when the rear side of the electronic device is viewed.
Figure 9:
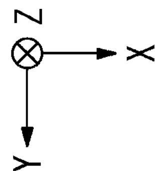

As illustrated in FIG. 9, the protrusion 42 has an end 42C that protrudes farthest in the negative x direction. The input portion 71 includes a protruding portion protruding in the negative x direction from the side cover 61 when the side cover 61 is viewed sideways, and the protruding portion of the input portion 71 has an end 71C facing in the positive y direction. The distance between the end 42C and the end 71C along the y-axis is denoted by L5. When an impact is exerted on the first side surface 14, a greater impact may be transmitted to the input portion 71 as the distance L5 becomes greater. To put it conversely, the impact transmitted to the input portion 71 can be reduced by decreasing the distance L5.

Figure 10:
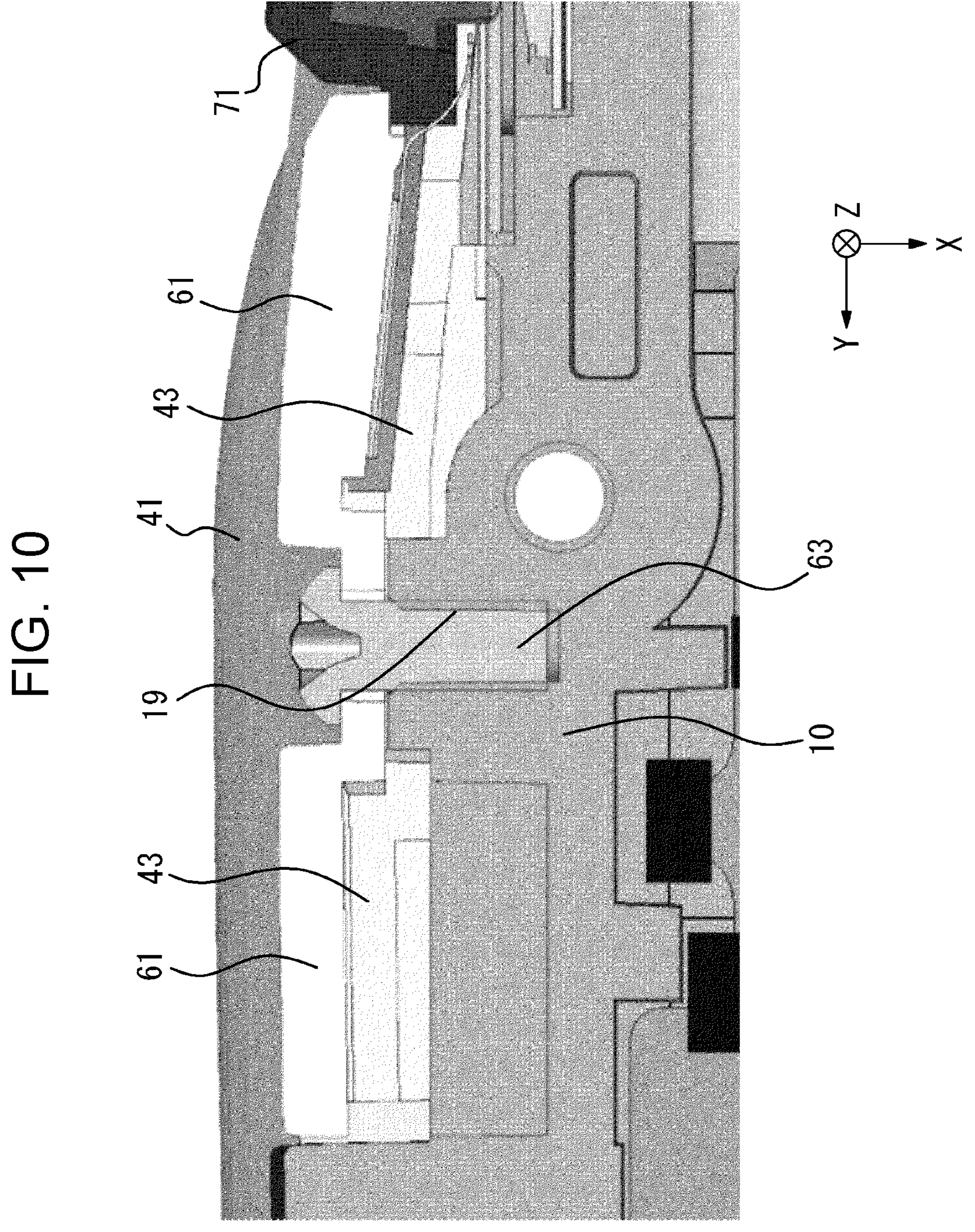
FIG. 10 is a cross-sectional view taken along line X-X in FIG. 8.

As illustrated in FIG. 10, which illustrates a cross section of the side cover 61, the connection portion 43 of the impact-absorption member 40 is sandwiched between the housing 10 and the side cover 61, thereby fixing the impact-absorption member 40 to the housing 10. The side cover 61 is joined to the housing 10 with the screw 63 being screwed in the tapped hole 19 of the housing 10. The impact-absorption member 40, however, is fixed to the housing 10 without using a joining member, such as a screw. When the side cover 61 is fixed to the housing 10 using the screw 63, the impact-absorption member 40 is also fixed together.

SUMMARY

As described above, the electronic device 1 according to an embodiment of the present disclosure includes the impact-absorption members 40 and 50 at respective opposite ends of the housing 10, and the impact-absorption members 40 and 50 are branched into end portions. The branched tines 41, 45, 51, and 55 of the impact-absorption members 40 and 50 protrude frontward, for example, from the surface 12A of the display 12, which increases the impact resistance of the electronic device 1. In addition, for example, an element such as the input portion 71 is disposed between the tines 41 and 42 at a first side surface 14 of the housing 10, which increases the impact resistance of the element such as the input portion 71. Moreover, the side cover 61 or 62 is fixed, using the screw, to the housing 10 between, for example, the tines 41 and 42 at the first side surface 14, which improves freedom in arranging elements, such as the input portions 71 and 72, at the first side surface 14.

In the embodiment described above, the impact-absorption member 40 extends continuously along the corresponding second side surface 16 of the housing 10 between two corners 18 positioned at respective opposite ends of the second side surface 16. The impact-absorption member 40, however, may consist of two separate members that are separated between the two corners 18. More specifically, the impact-absorption member 40 may include a portion extending along the first side surface 14 and a portion extending along the second side surface 16 from one of the two corners 18 positioned at respective opposite ends of the second side surface 16. In this case, the portion extending along the second side surface 16 from the one of the two corners 18 does not reach the other corner 18. In other words, the impact-absorption members 40 may be divided into two separate members corresponding to the two corners 18 at respective opposite ends of the second side surface 16 of the housing 10. This improves freedom in arranging elements of the electronic device 1. In addition, this improves the design freedom of the electronic device 1.

Embodiments of the present disclosure have been described with reference to the drawings and examples. Note that a person skilled in the art can make various modifications and alterations easily on the basis of the present disclosure. Accordingly, such modifications and alterations fall within the scope of the present disclosure. For example, functions included in constituent elements may be relocated insofar as such relocation does not pose a contradiction, and multiple constituent elements can be combined or a constituent element can be divided.

In the present disclosure, terms such as "first" and "second" are merely identifiers used to distinguish elements from each other. In the present disclosure, ordinal-number labels put on elements, such as "first" and "second", can be replaced with each other. For example, the "first" of the first face and the "second" of the second face are merely identifiers and can be replaced with each other. Such replacement is to be done simultaneously. Even if the identifiers are replaced with each other, the elements are still distinguished from each other. These identifiers can be deleted. When the identifiers are deleted from the names of the elements, the elements are to be distinguished from each other using reference signs. Identifiers, such as "first" and "second", should not be interpreted as a sequential order in the present disclosure. Presence of an ordinary number identifier does not provide a basis for the existence of other ordinary number identifiers that are smaller than that.

(1) An electronic device includes a housing, an impact-absorption member, and one or more electronic components inside housing. The housing includes a first side surface extending in a first direction, a second side surface extending in a second direction different from the first direction, and a corner of the first side surface and the second side surface. The impact-absorption member including a first end portion branched into a first tine and a second tine that are extending along the first side surface from the corner, and a middle portion covering the second side surface.

(2) In the electronic device described in (1) above, the housing may further include a third side surface located opposite to the first side surface, and a second corner of the third side surface and the second side surface. The impact-absorption member may further include a second end portion branched into a third tine and a fourth tine that are extending along the third side surface from the second corner.

(3) In the electronic device described in (2) above, the impact-absorption member may be branched at both ends of the middle portion when the second side surface of the housing is viewed in plan.

(4) In the electronic device described in any one of (2) to (3) above, the impact-absorption member may further include a first branching portion located at the first corner between the first end portion and the middle portion and a second branching portion located at the second corner between the second end portion and the middle portion.

(5) The electronic device described in (4) above may further include an end cover and a side cover. The end cover may include an engagement portion that is fixed to the impact-absorption member. The impact-absorption member may further include a connection portion between the first tine and the second tine, and the connection portion that is fixed to the side cover.

(6) In the electronic device described in (4) or (5) above, the housing may further include a first face surrounded by the first side surface, the second side surface and the third side surface. A housing may further include a second face opposite to the first face. The housing may further include a display at the first face. The first tine is closer to the display than second tine and is larger in height from the second surface than the display.

(7) The electronic device described in any one of (4) to (6) above may further include an input portion partially located between the first tine and the second tine at the first side surface. The first tine and the second tine are the larger in height from the first surface than at least part of input portion.

(8) A impact-absorption member including a middle portion extending along a first direction, and first and second corners on both side of the middle portion, a first end portion, and a second end portion. The first and second corners may sandwich the middle portion. The first end portion may be extending from the first corner and branched into a first tine and second tine that are extending along a second direction from the corner. A second end portion may be extending from the second corner and branched into a third tine and fourth tine that are extending along a second direction from the corner.

What is claimed is:

1. An electronic device including:
a housing including
a first side surface extending in a first direction,
a second side surface extending in a second direction different from the first direction, and
a first corner of the first side surface and the second side surface; and
an impact-absorption member including:
a first end portion branched into a first tine and a second tine that are extending along the first side surface from the first corner; and
a middle portion covering the second side surface; and
one or more electronic components inside housing,
wherein the first tine extends to a first free end that is exposed at a position along the first side surface and the second tine extends to a second free end that is exposed at a position along the first side surface.

2. The electronic device according to claim 1,
wherein the housing further includes:
a third side surface located opposite to the first side surface; and
a second corner of the third side surface and the second side surface, and
the impact-absorption member further including a second end portion branched into a third tine and a fourth tine that are extending along the third side surface from the second corner.

3. The electronic device according to claim 2,
wherein the impact-absorption member is branched at both ends of the middle portion when the second side surface of the housing is viewed in plan.

4. The electronic device according to claim 1,
wherein the impact-absorption member further includes:
a first branching portion located at the first corner between the first end portion and the middle portion; and
a second branching portion located at the second corner between the second end portion and the middle portion.

5. The electronic device according to claim 4, further including:
an end cover; and
a side cover,
wherein the end cover includes an engagement portion, engagement portion that is fixed to the impact-absorption member, and
wherein the impact-absorption member further includes a connection portion between the first tine and the second tine, and the connection portion that is fixed to the side cover.

6. The electronic device according to claim 4,
wherein the housing further includes:
a first face surrounded by the first side surface, the second side surface and a third side surface; and
a second face opposite to the first face,
wherein the housing further includes a display at the first face,
wherein the first tine is closer to the display than the second tine, and
wherein the first tine is larger in height from the second surface than the display.

7. The electronic device according to claim 4, further including:
an input portion partially located between the first tine and the second tine at the first side surface,
wherein the first tine and the second tine are the larger in height from the first surface than at least part of the input portion.

8. An impact-absorption member including:
a middle portion, extending along a first direction;
first and second corners on both side of the middle portion, sandwiching the middle portion;
a first end portion extending from the first corner, and branched into a first tine and a second tine that are extending along a second direction from the first corner; and
a second end portion extending from the second corner, and branched into a third tine and a fourth tine that are extending along the second direction from the second corner,
wherein the first tine extends to a first free end that is exposed at a position along a first side surface of a housing and the second tine extends to a second free end that is exposed at a position along the first side surface.

9. An electronic device including:
a housing including
a first side surface extending in a first direction,
a second side surface extending in a second direction different from the first direction, and
a first corner of the first side surface and the second side surface;
an impact-absorption member including:
a first end portion branched into a first tine and a second tine that are extending along the first side surface from the first corner; and
a middle portion covering the second side surface;
a first branching portion located at the first corner between the first end portion and the middle portion; and a second branching portion located at the second corner between the second end portion and the middle portion;

one or more electronic components inside housing;

an end cover; and a side cover, wherein the end cover includes an engagement portion, engagement portion that is fixed to the impact-absorption member, and wherein the impact-absorption member further includes a connection portion between the first tine and the second tine, and the connection portion that is fixed to the side cover.

* * * * *